(12) United States Patent
Van Den Brink et al.

(10) Patent No.: US 8,704,516 B2
(45) Date of Patent: Apr. 22, 2014

(54) PASSIVE SHIMS TO INCREASE THE EFFECTIVE $B_0$ AND $B_1$ UNIFORMITY IN A BODY COIL

(75) Inventors: Johan Samuel Van Den Brink, Eindhoven (NL); Cornelis Leonardus Gerardus Ham, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 807 days.

(21) Appl. No.: 12/808,399

(22) PCT Filed: Dec. 22, 2008

(86) PCT No.: PCT/IB2008/055479
§ 371 (c)(1), (2), (4) Date: Jun. 16, 2010

(87) PCT Pub. No.: WO2009/081377
PCT Pub. Date: Jul. 2, 2009

(65) Prior Publication Data
US 2010/0277174 A1 Nov. 4, 2010

(30) Foreign Application Priority Data
Dec. 21, 2007 (EP) .................................... 07123901

(51) Int. Cl.
*G01V 3/00* (2006.01)
*G01R 33/48* (2006.01)

(52) U.S. Cl.
USPC ........... 324/309; 324/307; 324/318; 324/322; 600/410

(58) Field of Classification Search
USPC ............................ 324/300–322; 600/407–465
See application file for complete search history.

(56) References Cited

U.S. PATENT DOCUMENTS

| 5,463,363 | A | * | 10/1995 | Ogawa | 335/299 |
| 5,650,724 | A | | 7/1997 | Yamagata | |
| 6,294,972 | B1 | * | 9/2001 | Jesmanowicz et al. | 335/301 |
| 7,459,908 | B2 | * | 12/2008 | Juchem | 324/320 |
| 2003/0109783 | A1 | | 6/2003 | Heid et al. | |

(Continued)

FOREIGN PATENT DOCUMENTS

WO 2005093450 A1 10/2005
WO 2007034341 A2 3/2007

OTHER PUBLICATIONS

"Adjustable Subject-Specific Passive Shims Using Optimized Distributions of Bismuth and Zirconium" Koch et al, Proceedings of the Int. Soc. for Magnetic Resonance in Medicine, 14th meeting proceedings, May 6, 2006, p. 519.

(Continued)

Primary Examiner — Melissa Koval
Assistant Examiner — Emily Chan

(57) ABSTRACT

A magnetic resonance imaging system (10) includes a local coil (40) for receiving a resonance signal induced by a whole body quadrature coil (32). The local coil (40) includes a dielectric former (68) in which a plurality of receive coils (60, 74, 76, 78) and a passive $B_0$ and $B_1$ field shim (62, 82) are mounted. The passive shim includes a plurality of capacitively coupled elements (64) of an electrically conductive diamagnetic, paramagnetic, ferromagnetic material which passively shield and enhance the field in local regions. A surface configuration of the elements is tailored to optimize local $B_1$ homogeneity and a mass of the elements is configured to optimize local $B_0$ field homogeneity.

10 Claims, 4 Drawing Sheets

(56) References Cited

U.S. PATENT DOCUMENTS

| | | | |
|---|---|---|---|
| 2005/0077899 A1* | 4/2005 | Jacobs | 324/320 |
| 2005/0104591 A1 | 5/2005 | Qu et al. | |
| 2007/0030004 A1* | 2/2007 | Amor et al. | 324/318 |
| 2007/0170917 A1 | 7/2007 | Thompson et al. | |
| 2008/0272787 A1* | 11/2008 | Boskamp et al. | 324/322 |

OTHER PUBLICATIONS

"Manipulation of Image Intensity Distribution at 7.0 T Passive RF Shimming and Focusing with Dielectric Materials", Yang Qing et al, Journal of Magnetic Resonance Imaging, Jul. 2006, vol. 24, No. 1 Jul. 2006 p. 197-202.

* cited by examiner

US 8,704,516 B2

PASSIVE SHIMS TO INCREASE THE EFFECTIVE $B_0$ AND $B_1$ UNIFORMITY IN A BODY COIL

FIELD OF THE INVENTION

The present application relates to the magnetic resonance arts. It finds particular application in conjunction with magnetic resonance imaging using quadrature body coils for resonance excitation and will be described with particular reference thereto. It is to be appreciated, however, that the present application will also find application in conjunction with other types of magnetic resonance imaging, spectroscopy, and other diagnostic techniques which use radio frequency coils.

BACKGROUND OF THE INVENTION

In magnetic resonance imaging, a region to be imaged is subject to a main or $B_0$ magnetic field. RF or $B_1$ pulses are transmitted into the region of interest from a quadrature body coil, for example, to excite and manipulate magnetic resonance. Gradient magnetic fields are applied to encode spatial position through phase encoding, frequency encoding, and the like. Magnetic resonance signals from the induced resonance are received with local coils or the quadrature body coil for reconstruction into an image.

Particularly at higher magnetic fields, the body of the patient alters the uniformity of the main, $B_0$ magnetic field and the RF or $B_1$ field.

The $B_0$ magnetic field has been shimmed with active shim coils as well as with passive shims. More specifically, ferrous material is positioned at appropriate positions, generally adjacent the main field coil, in order to shim the $B_0$ field into greater uniformity. Although others have addressed $B_1$ field inhomogeneities, the typical solutions look to improved coil design. For example, $B_1$ field uniformity can be increased through the use of local coils which generate a substantially homogeneous $B_1$ field into small targeted anatomical regions in which the $B_1$ field is designed to be homogeneous.

The present application proposes an improved shimming solution to the above-referenced problems.

SUMMARY OF THE INVENTION

In accordance with one aspect, a local coil for a magnetic resonance system is provided. The local coil includes a dielectric former. One or more receive coils are supported by the former. Passive $B_0$ and $B_1$ field shims for homogenizing $B_0$ and $B_1$ fields adjacent the receive coils are supported by the former.

In accordance with another aspect, a magnetic resonance imaging system is provided. A main magnet generates a $B_0$ field through an examination region and gradient coils generate gradient magnetic fields through the examination region. A quadrature body coil generates $B_1$ field pulses in the examination region which are received by the local coil described above.

In accordance with another aspect, a magnetic resonance method is provided. A $B_0$ field is generated through an examination region and magnetic field gradients are applied across the examination region. $B_1$ field pulses are applied to the examination region and received with the local coil described above. The received magnetic resonance signals are reconstructed into an image representation.

In accordance with another aspect, a method of making a local RF coil for use in magnetic resonance imaging is provided. Local receive coils are mounted in a former. A passive $B_0$ field and $B_1$ field shim are also mounted in the former.

One advantage resides in improved $B_0$ and $B_1$ field homogeneity.

Another advantage resides in an improved uniformity in $B_1$ field strength.

Another advantage resides in concurrent $B_0$ and $B_1$ field shimming.

Another advantage resides in reduced size and weight by integrating $B_0$ and $B_1$ shimming into single design entities.

Still further advantages will become apparent to those of ordinary skill upon reading and understanding the following detailed description.

BRIEF DESCRIPTION OF THE DRAWINGS

These and other aspects will be described in detail hereinafter, by way of example, on the basis of the following embodiments, with reference to the accompanying drawings, wherein.

Corresponding reference numerals when used in the various figures represent corresponding elements in the figures.

DETAILED DESCRIPTION OF EMBODIMENTS

Figure 1:
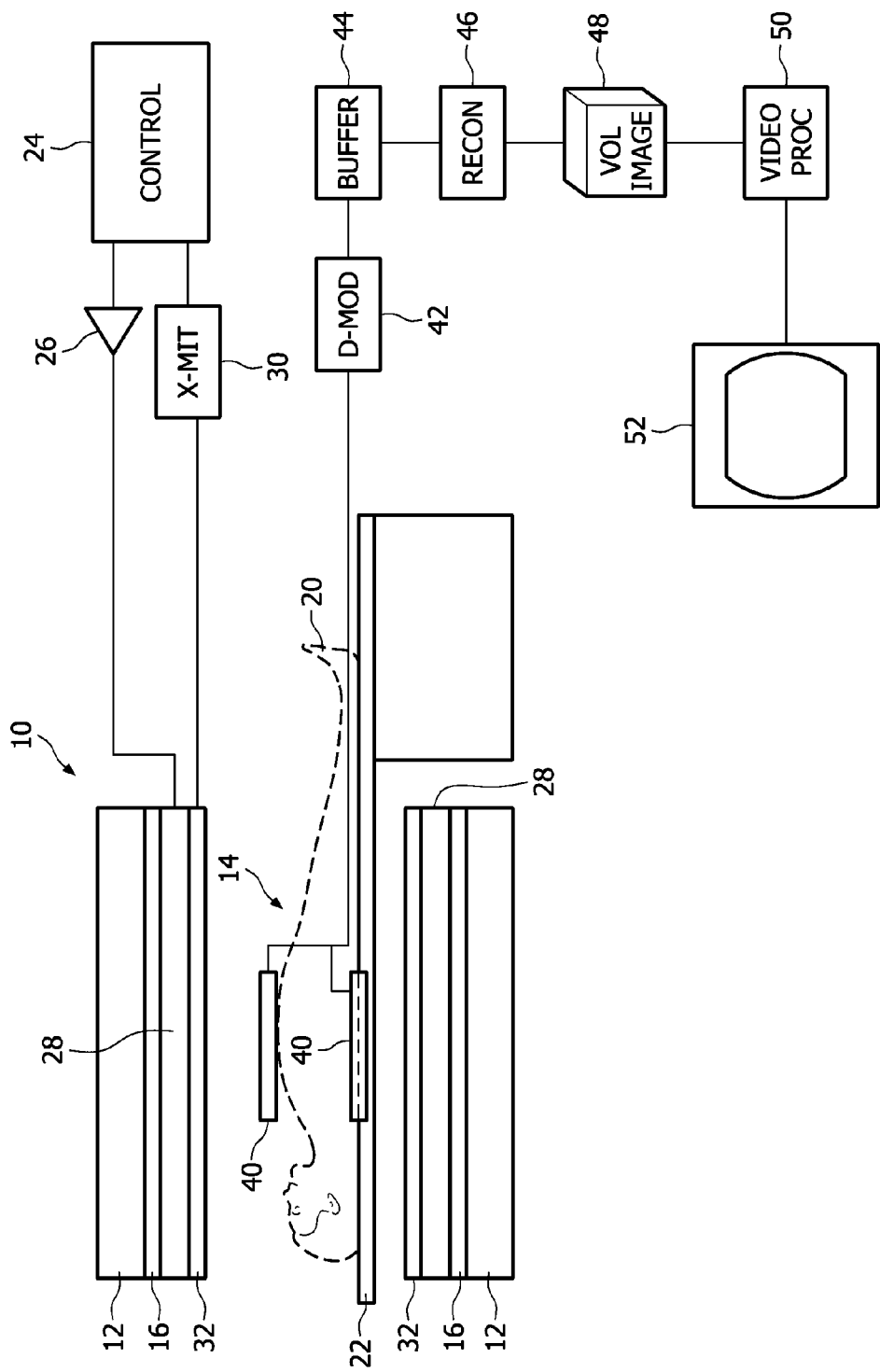
FIG. 1 is a diagrammatic illustration in transverse section of a local coil in accordance with the present concept in combination with a magnetic resonance imaging system.

With reference to FIG. 1, a magnetic resonance imaging system 10 includes a main field magnet 12, such as a superconducting magnet, a resistive magnet, or the like which is configured as a coil, a pair of parallel magnets, or the like. The main field coil 12 generates a generally uniform main or $B_0$ magnetic field through an examination region 14. In order to optimize uniformity of the $B_0$ field, active or passive shim coils 16 are provided adjacent the main field magnet 12. Although the $B_0$ shim coils 16 are effective for improving the uniformity of the $B_0$ field, introduction of the subject into the examination region 14 introduces subject dependent $B_0$ field distortions. These distortions vary with the subject, the size of the subject, the region of the subject to be imaged, whether the subject is centered in the examination region, and the like.

Figure 2:
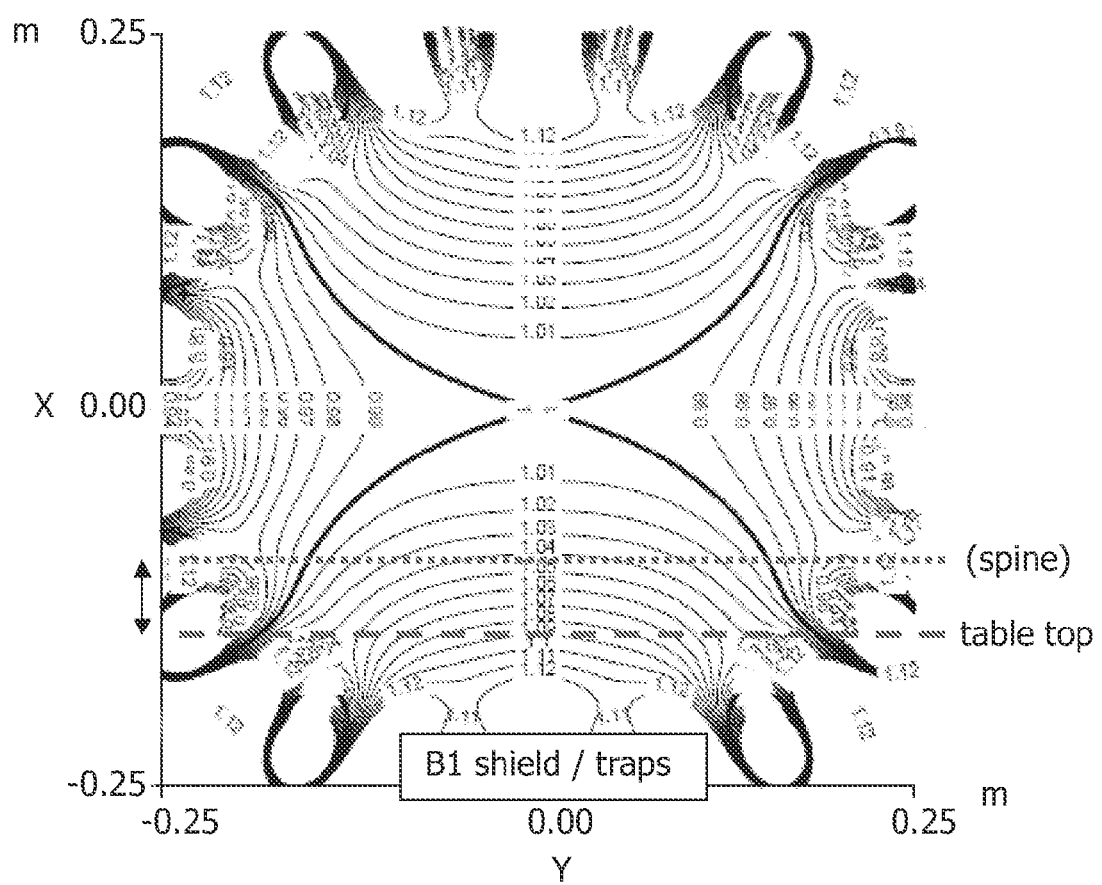
FIG. 2 illustrates a typical $B_1$ field diagram.

In a magnetic resonance imaging procedure, a subject 20 is disposed on a subject support 22 which moves a region of interest of the subject into the examination region 14. A system controller 24 applies appropriate control signals to gradient amplifiers 26 and gradient coils 28 to generate gradient magnetic fields across the examination region 14. The controller 24 further causes a transmitter 30 to apply appropriate RF field transmit pulses to whole body RF coil 32 which emits a $B_1$ field to excite and manipulate magnetic resonance in the region of interest of the subject in the examination region 14. In the example of a cylindrical whole body RF coil 32, the coil is configured to generate the $B_1$ field as illustrated in FIG. 2 which has optimal homogeneity adjacent the center of the whole body RF coil and the examination region. The strength of the $B_1$ field increases from the center of the whole body coil towards the periphery of the examination region, e.g. by about 10%. In addition, patient's conductivity and permittivity will alter the $B_1$ uniformity, which deviations are largely determined by gross anatomical structures, i.e. are similar between individuals for a given region of interest and anatomy. Receive coils target specific anatomies, and can be equipped with targeted shim trays.

A local coil 40 is disposed adjacent a region of interest, e.g. a cardiac region, for receiving magnetic resonance signals. The received resonance signals are demodulated by a demodulator 42 such as a receiver and stored in a buffer memory 44. A reconstruction processor or routine 46 reconstructs the resonance signals into a volumetric image representation which is stored in a volume image memory 48. A video processor 50 assembles selected portions of the volumetric image representation from the volume image memory 48 into appropriate format for display on a monitor or other display 52. Common display formats include one or more slice images, volume rendering, maximum intensity projection, and the like.

Figure 3:
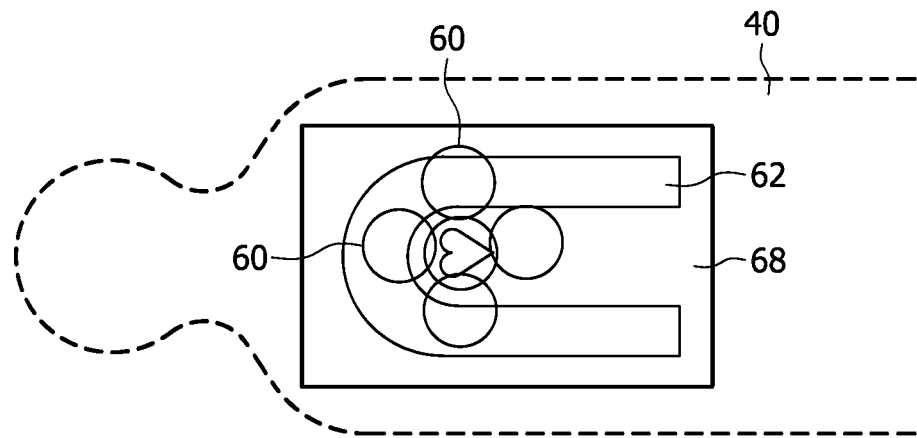
FIG. 3 is a diagrammatic plan view of the local coil of FIG. 1 shown overlayed on an exemplary patient.

With reference to FIG. 3, the local coil 40, in one embodiment, includes a plurality of receive coils 60 and a combined $B_1/B_0$ passive shim arrangement 62. The shims alter the $B_0$ and $B_1$ fields to provide both passive shielding to some regions and passive enhancements to others. In the illustrated heart imaging example for embodiment, the passive shim 62 is disposed in horseshoe shape extending over the lungs to compensate for the $B_1$ field alterations caused by air in the lungs and extends above the heart to compensate for $B_1$ and $B_0$ field distortion attributable to a change in body mass, between the torso and the neck. Because $B_1$ increases towards the lungs, the shims are placed to focus decaying field response. If the passive shim 62 were a continuous sheet, it could be subject to eddy currents. As illustrated in the FIG. 4 detail, the passive shield includes a plurality of segments 64 separated from each other by a gap but connected by capacitors 66. In this manner, a U-shaped shield in the cardiac example or other shaped $B_1$ shield is provided that does not support eddy currents.

In order to shim for both $B_0$ and $B_1$ fields, the segments 64 are constructed of nonmagnetic, diamagnetic, paramagnetic or ferromagnetic tiles, or a combination thereof. The $B_1$ currents typically penetrate only 1-3 skin depths. Hence, only thin foil-like tiles are needed for $B_1$ shimming with the amount of shimming being determined by surface area and shape. $B_0$ shimming, on the other hand, is a function of the mass of material. This enables both $B_0$ and $B_1$ shimming criteria to be met. That is, the surface area of each tile is configured to meet the $B_1$ shimming requirements and the thickness of each tile is selected to meet the $B_0$ shimming requirements. Thus, where no $B_0$ shimming is needed, a very thin tile of a nonmagnetic, diamagnetic, paramagnetic or ferromagnetic element, or a combination thereof, can be used. Where more $B_0$ shimming is wanted, the tiles are made thicker. The tiles are most effective when oriented parallel to the field.

In one embodiment, the receive coils 60 and the passive shim 62 are encased in a former made of plastic resin 68. In one embodiment, the local coil 40 is embodied in two flat sheets of the construction discussed in conjunction with FIG. 3. One of the local coil assemblies is positioned above the patient with the U-shaped passive shim around the heart and the other is positioned in a like location below the patient. Alternately, the local coil can be flexible or bendable and the receive coils can extend around the patient's torso. The $B_1$ shield effect tends to shift the center of the homogeneous $B_1$ field region. Specifically, a $B_1$ shield disposed below the patient reduces the $B_1$ field strength adjacent the shield and draws the center of the homogeneous region downward and the $B_1$ shield above the patient reduces the $B_1$ field strength adjacent itself and draws the homogeneous $B_1$ field region upward. Relative amounts of $B_1$ shielding above and below the patient are selected to compensate for the lungs and also position the center of the homogeneous $B_1$ field region centered on the heart or other region of interest.

Other local coil constructions are also contemplated. For example, the passive shim segments 64 can be tiles coated with an insulating material and layered or lapped to provide a capacitive coupling. In another embodiment, the segments 64 are in the form of particles or small platelets, whiskers, or the like which are intermixed with a plastic resin. In regions in which a relatively high amount of $B_1$ and a relatively low amount of $B_0$ shimming is needed, platelets can be utilized. In regions in which more $B_0$ shimming is called for, larger particles, thicker platelets or whiskers are used and can be supplemented with larger diamagnetic, paramagnetic or ferromagnetic (or a combination thereof) pieces such as small balls, rods, and the like.

Often, fat-suppression techniques are used during imaging. Fat suppression techniques function best when the uniformity of the $B_0$ field is optimized. In designing local coils or portions of local coils that are configured for use with portions of the anatomy in which fat suppression is commonly used, the $B_0$ field deforming nature of the adjacent region of a nominal patient is used as a design criteria for the $B_0$ shimming.

In a spine coil embodiment, the spine as denoted in FIG. 2 is adjacent the table top and below the most homogeneous part of the $B_1$ field. A sheet of segments as discussed above is placed below the subject, e.g. in the table top, to bring the uniformity region down to the spine.

Figure 5:
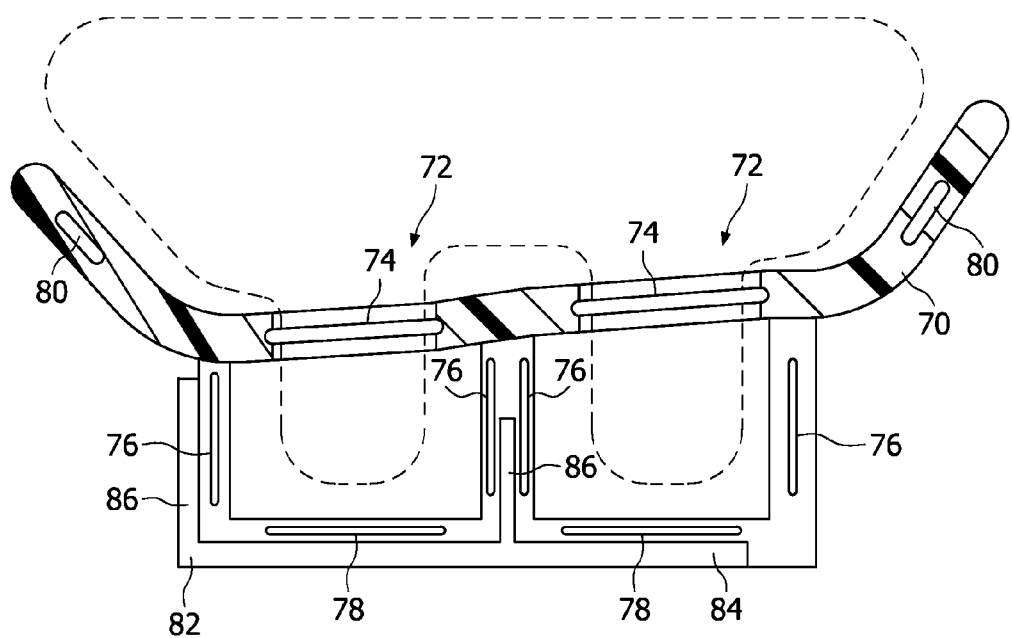
FIG. 5 is a diagrammatic illustration of a breast imaging system.

With reference to FIG. 5, a quadrature whole body coil is typically connected with the RF transmitter at a pair of 90° displaced positions. This asymmetric coupling to the quadrature whole body coil tends to cause a $B_1$ asymmetry. When both of the 90° offset driving ports of the quadrature whole body coil are disposed on one side of the coil, the $B_1$ field has a left/right asymmetry. A breast coil illustrated in FIG. 5 includes a dielectric patient support 70 which defines breast receiving apertures 72. The apertures are surrounded by a pair of local receive coil loops 74. Additional local receive coil elements 76 are disposed on sides of each breast. Optionally, an additional local receive coil element 78 is positioned below the breast. Segmented $B_0$ shims 80 are positioned in the dielectric support 70 along the sides of the torso. Although the passive shims 80 are primarily for $B_0$ shimming, they may also provide passive $B_1$ shimming to extend the field uniformity especially into the arm pits for improved visualization of the sentinel nodes.

A passive shim construction 82 is disposed more towards a weaker side of the $B_1$ field to balance the $B_1$ fields in the imaged breast regions. The passive shim 82 includes a base portion 84 for lowering the homogeneous center of the $B_1$ field into alignment with the imaged breast regions. The base region, optionally, extends below both breasts. Additional, generally vertical passive shim portions 86 draw the homogeneous center of the $B_1$ field to one side, left in the orientation of FIG. 5. Again, the passive shim 82 is configured to provide both passive $B_1$ field shimming and $B_0$ field shimming. The placement and the thickness or mass of the conductive and diamagnetic, paramagnetic or ferromagnetic pieces, or combinations thereof, being selected in accordance with the nominal $B_0$ field distortions caused by this region of the anatomy.

In brain imaging, a quadruple $B_1$ artifact tends to align along the anterior-posterior plane. To correct for this artifact, the shims are positioned along that axis or even into the headset to have increased right-left sensitivity shielding.

Figure 4:
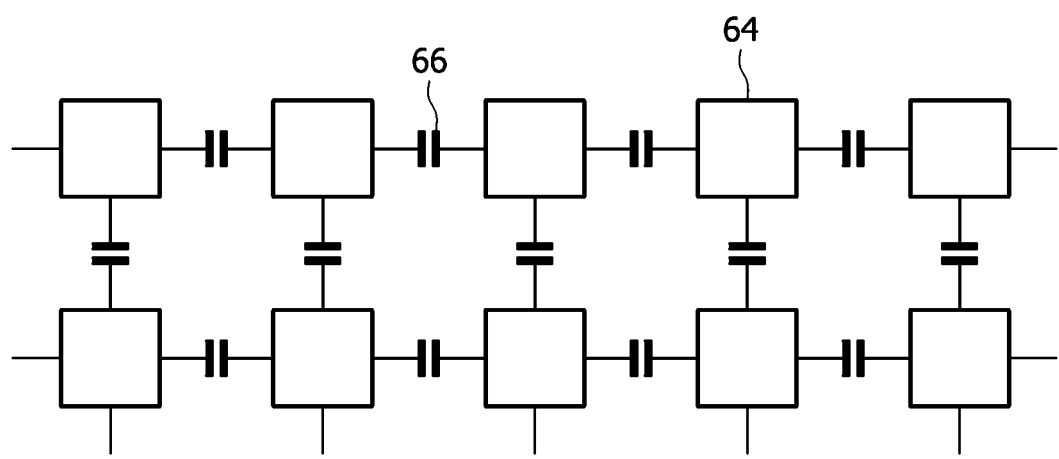
FIG. 4 is a detailed illustration of a portion of the $B_0/B_1$ field shim of FIG. 3.

The passive shim segments 64 shown in FIG. 4 can also be designed to correct anatomically induced $B_0$ field inhomogeneities and enhance main magnet homogeneity in a local region of interest. Such local $B_0$ uniformity enhancement is, again, particularly important when fat suppression techniques are used.

When the region to be imaged is off center, the subject is often placed off-center to put the region of interest in the center of the examination region. Local coils for these regions use the off-set $B_0$ distortion of a nominal subject as a basis for $B_0$ shim design. The closer the $B_0$ shim material can be placed to the region of interest, the lower the needed mass. Iron and other ferrous materials are most effective over short distance.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A local coil for a magnetic resonance system, the local coil comprising:
   a dielectric former;
   one or more receive coils supported by the former; and
   a plurality of passive $B_0$ and $B_1$ field shims, each shim being configured to homogenize $B_0$ and $B_1$ fields adjacent the receive coils supported by the former,
   wherein the $B_0$ field is a main magnetic field generated by a main field coil through an examination region, and the $B_1$ field is emitted by a radio frequency (RF) coil in response to RF field transmit pulses;
   wherein the passive B0 and B1 field shims include pieces of a material, each piece of material being both electrically conductive and diamagnetic, paramagnetic or ferromagnetic; and
   wherein the pieces include capacitively coupled tiles.

2. The local coil according to claim 1, wherein the pieces include at least one of platelets and particles.

3. The local coil according to claim 1, wherein the passive $B_0$ and $B_1$ shims are disposed in a generally U-shaped pattern configured to overlay a nominal subject's lungs to either side of the heart and passing across a top of the heart.

4. The coil according to either of claim 1, wherein the passive shims are configured asymmetrically in a transverse direction to correct for left/right asymmetry in at least one of the $B_0$ and $B_1$ fields.

5. The coil according to claim 1, wherein the passive shims passively shield and enhance the $B_1$ and $B_0$ fields in local regions.

6. A magnetic resonance imaging system comprising:
   the main field coil for generating the $B_0$ field through the examination region;
   gradient coils for generating gradient magnetic fields through the examination region;
   the RF coil for generating the $B_1$ field pulses in the examination region; and
   a local coil according to claim 1 disposed in the examination region.

7. A local coil for a magnetic resonance system, the local coil comprising:
   a dielectric former;
   at least one receive coil supported by the dielectric former; and
   a passive shim for homogenizing a $B_0$ field and a $B_1$ field adjacent the at least one receive coil, the passive shim comprising a plurality of passive shim segments,
   wherein a thickness of each passive shim segment is configured to meet shimming requirements of the $B_0$ field and a surface area of each passive shim segment is configured to meet shimming requirements for the $B_1$ field;
   wherein the plurality of segments is interconnected to by a plurality of capacitors.

8. The local coil of claim 7, wherein the plurality of segments is encased in the dielectric former.

9. The local coil of claim 7, wherein the plurality of segments comprises a plurality of tiles formed of at least one of a nonmagnetic, diamagnetic, paramagnetic and ferromagnetic element.

10. The local coil of claim 9, wherein the plurality of tiles is oriented parallel to the $B_0$ field.

* * * * *